(12) United States Patent
Sakai et al.

(10) Patent No.: US 9,779,966 B2
(45) Date of Patent: Oct. 3, 2017

(54) LEAD FRAME AND SEMICONDUCTOR DEVICE

(71) Applicant: SHINKO ELECTRIC INDUSTRIES CO., LTD., Nagano-ken (JP)

(72) Inventors: Naoya Sakai, Nagano (JP); Shin Ekimoto, Nagano (JP); Tatsuya Inatsugu, Nagano (JP); Mitsuharu Sato, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/222,441

(22) Filed: Jul. 28, 2016

(65) Prior Publication Data
US 2017/0040183 A1    Feb. 9, 2017

(30) Foreign Application Priority Data

Aug. 7, 2015  (JP) ................................ 2015-156796

(51) Int. Cl.
*H01L 21/48*  (2006.01)
*H01L 23/31*  (2006.01)
*H01L 23/495*  (2006.01)

(52) U.S. Cl.
CPC ...... *H01L 21/4821* (2013.01); *H01L 21/4842* (2013.01); *H01L 23/4952* (2013.01); *H01L 23/49541* (2013.01); *H01L 23/49548* (2013.01); *H01L 23/49582* (2013.01); *H01L 23/3107* (2013.01); *H01L 23/49503* (2013.01); *H01L 23/49513* (2013.01); *H01L 23/49551* (2013.01); *H01L 2224/48247* (2013.01); *H01L 2224/49171* (2013.01); *H01L 2924/181* (2013.01)

(58) Field of Classification Search
CPC ......... H01L 2924/0002; H01L 2924/00; H01L 23/49541; H01L 23/49558
USPC .......... 257/E23.043, E23.049, 672, 674, 676
See application file for complete search history.

(56) References Cited

U.S. PATENT DOCUMENTS

| | | | | |
|---|---|---|---|---|
| 5,517,056 A | * | 5/1996 | Bigler | H01L 21/565 257/666 |
| 6,034,422 A | * | 3/2000 | Horita | H01L 23/49582 257/666 |
| 6,087,714 A | * | 7/2000 | Kubara | H01L 23/49582 257/666 |

FOREIGN PATENT DOCUMENTS

| JP | 1-35503 B2 | 7/1989 |
|---|---|---|
| JP | 2648353 B2 | 5/1997 |

* cited by examiner

*Primary Examiner* — Edward Chin
(74) *Attorney, Agent, or Firm* — Tarolli, Sundheim, Covell & Tummino LLP

(57) ABSTRACT

A lead frame includes a dam bar and leads connected by the dam bar. Each lead includes an inner lead, which is located at one side of the dam bar, and an outer lead, which is located at the other side of the dam bar and formed integrally with the inner lead. Each inner lead includes a basal portion located at a side closer to the dam bar, a distal portion located at the opposite side of the basal portion, and an intermediate portion connecting the distal and basal portions and having a width that differs from the distal portion. A plating layer covers an upper surface and a side surface of the distal portion and at least part of a side surface of the intermediate portion. Side surfaces of the basal portion and the dam bar are entirely located outside the plating layer.

9 Claims, 11 Drawing Sheets

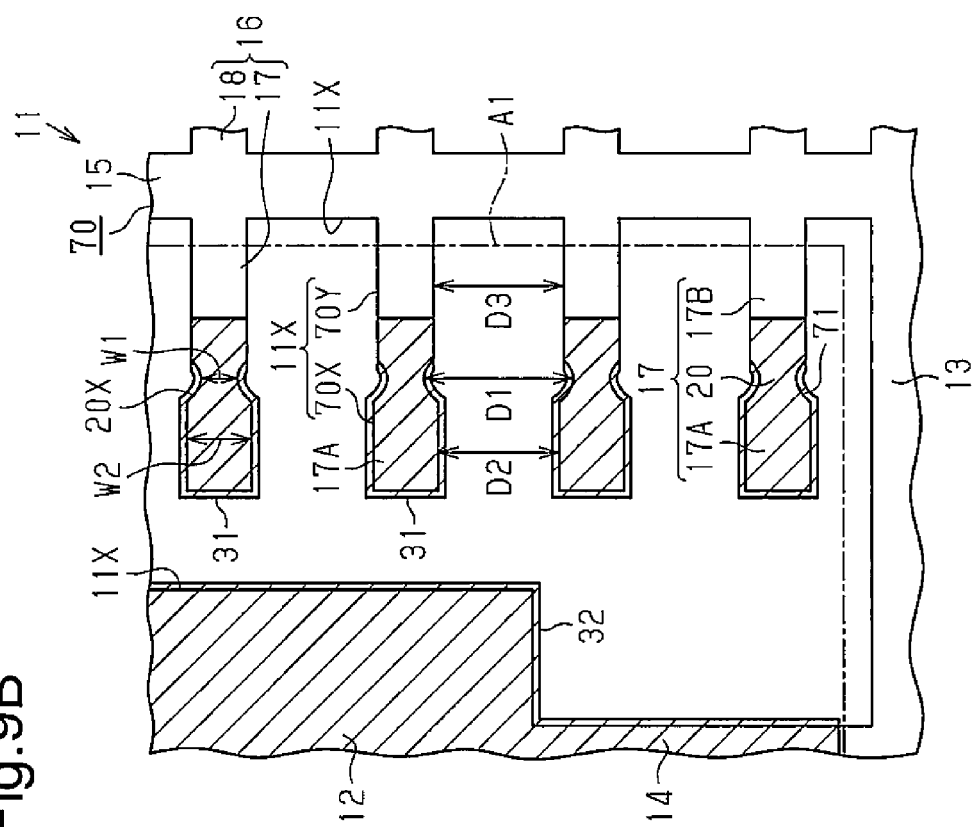
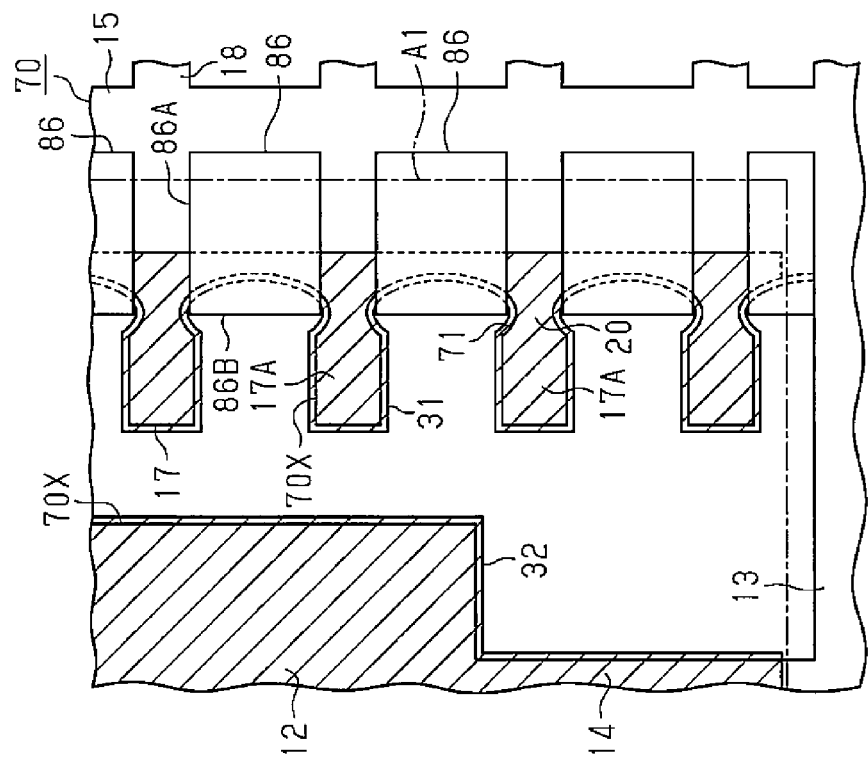

LEAD FRAME AND SEMICONDUCTOR DEVICE

CROSS-REFERENCE TO RELATED APPLICATIONS

This application is based upon and claims the benefit of priority from prior Japanese Patent Application No. 2015-156796, filed on Aug. 7, 2015, the entire contents of which are incorporated herein by reference.

FIELD

This disclosure relates to a lead frame, a semiconductor device, and a method for manufacturing a lead frame.

BACKGROUND

A lead frame for a semiconductor device is used to mount a semiconductor device on a substrate or the like. A semiconductor element is mounted on the lead frame and encapsulated in a resin material together with the lead frame. Japanese Patent No. 2648353 and Japanese Examined Patent Publication No. 1-35503 each describe a conventional lead frame. For example, a lead frame includes a die pad on which a semiconductor element is mounted, an inner lead electrically connected to the semiconductor element, and an outer lead formed integrally with the inner lead and used as an external connection terminal when mounting a semiconductor device on the substrate or the like. In this type of a lead frame, a plating layer is formed on the surfaces of the die pad and the inner lead to improve the mounting characteristics of semiconductor elements and the connectivity to metal wires (bonding wires). This type of a lead frame is formed through, for example, the manufacturing process described below.

Referring to FIG. 13A, a mask 110 is first formed on a flat metal plate 100. The mask 110 covers, for example, a portion of the metal plate 100 that is used as an outer lead. Then, in the step illustrated in FIG. 13B, electrolytic plating is performed using the mask 110 as a plating mask and the metal plate 100 as a power supplying layer to form a plating layer 101 on the upper surface of the metal plate 100 located outside the mask 110. In the step illustrated in FIG. 13C, stamping is performed to form an opening 100X in the metal plate 100. The opening 100X defines a die pad 102, inner leads 103, and outer leads 104. The plating layer 101 is formed on the upper surface of the die pad 102 and the upper surface of a distal portion 103A of each inner lead 103.

In the manufacturing method described above, after the plating layer 101 is formed, a coining process is performed on the distal portions 103A of the inner leads 103. The coining process may change the crystal structure at the surface of the plating layer 101 (e.g., silver plating layer). For example, when the crystal structure changes and increases the hardness of the plating layer 101, connections of metal wires may become defective and the bonding strength of metal wires may decrease. The coining process is a process that presses and flattens the surface of a processed subject with a stamping die.

SUMMARY

One aspect of a lead frame is a lead frame including a dam bar and leads connected to each other by the dam bar. Each of the leads includes an inner lead, which is located at one side of the dam bar, and an outer lead, which is located at another side of the dam bar and formed integrally with the inner lead. A plating layer is formed on each inner lead. Each inner lead includes a basal portion located at a side closer to the dam bar, a distal portion located at a side opposite to the basal portion, and an intermediate portion that connects the distal portion and the basal portion and has a width that differs from that of the distal portion. The plating layer covers an upper surface and a side surface of the distal portion and covers at least part of a side surface of the intermediate portion. A side surface of the basal portion and a side surface of the dam bar are entirely located outside the plating layer.

Other embodiments and advantages thereof will become apparent from the following description, taken in conjunction with the accompanying drawings, illustrating by way of example the principles of this enclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 8A, 8B, 9A, 9B, and 10A are enlarged plan views illustrating the method for manufacturing the lead frame of FIG. 1A;

DESCRIPTION OF THE EMBODIMENTS

Figure 1A:
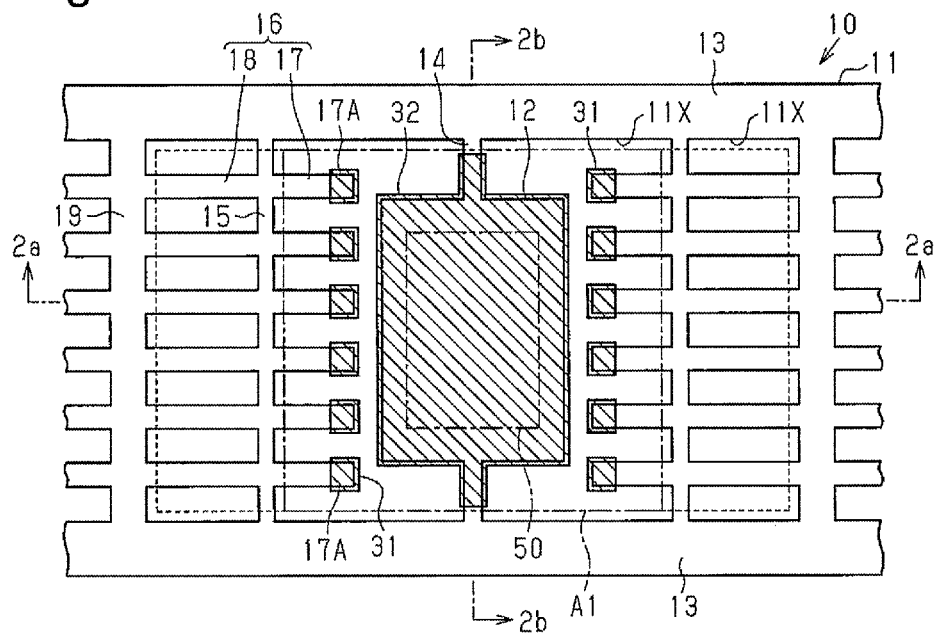
FIG. 1A is a schematic plan view illustrating one embodiment of a lead frame.

One embodiment will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

Referring to FIG. 1A, a lead frame 10 includes a frame base 11 used as a substrate for a small outline package (SOP). The material of the frame base 11 may be, for example, copper (Cu), a Cu-based alloy, iron-nickel (Fe—Ni), an Fe—Ni-based alloy, or the like. The frame base 11 is, for example, stamped out of a metal plate.

The frame base 11 is rectangular in a plan view and includes a die pad 12. A semiconductor element 50 is mounted on the die pad 12, which is rectangular in a plan view. Two rails 13 are formed at the two edges extending in the longitudinal direction (lateral direction as viewed in FIG. 1A) of the frame base 11. The die pad 12 is supported by a plurality of (e.g., two) support bars 14 connected to the two rails 13. The die pad 12 includes a first end surface and a second end surface that are parallel to the rails 13 and a third end surface and a fourth end surface that are connected to the first end surface and the second end surface and extend perpendicular to the rails 13 in a plan view (in vertical direction as viewed in FIG. 1A). Each support bar 14 is connected to the first end surface or the second end surface of the die pad 12. Leads 16 that are connected to one another by a dam bar 15 are arranged next to the third end surface of the die pad 12. Leads 16 that are connected to one another by a dam bar 15 are also arranged next to the fourth end surface of the die pad 12. For example, each dam bar 15 extends perpendicular to the two rails 13 to connect the leads 16 to the rails 13.

Each lead 16 includes an inner lead 17 and an outer lead 18. The inner lead 17, which is located on one side of the corresponding dam bar 15, extends toward the die pad 12. The outer lead 18, which is located on the other side of the dam bar 15, extends away from the die pad 12. Thus, the basal end of the inner lead 17 and the basal end of the outer lead 18 are connected to the corresponding dam bar 15. The distal end of each outer lead 18 (i.e., end opposite to dam bar 15) is connected to one of two inner frames 19. The two inner frames 19 extend perpendicular to the rails 13 in a plan view to connect the leads 16 to the rails 13 in the same manner as the dam bars 15. The die pad 12, the support bars 14, the dam bars 15, and the leads 16 (inner leads 17 and outer leads 18) are defined by openings 11X extending through the frame base 11 in the thickness-wise direction.

Figure 5:
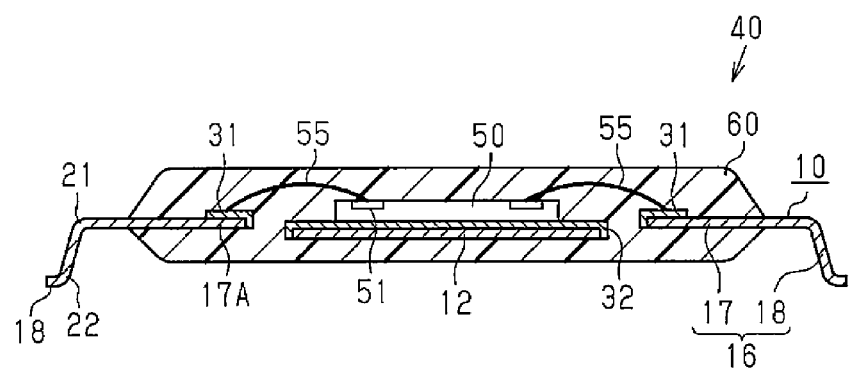
FIG. 5 is a cross-sectional view taken along line 5-5 in FIG. 4.

In FIG. 1A, the rectangle in single-dashed lines extending around the basal portions of the inner leads 17 and the basal portions of the support bars 14 indicates a resin encapsulation area A1 which is encapsulated in an encapsulation resin 60 (refer to FIG. 5). The die pad 12 and the inner leads 17 are encapsulated in the encapsulation resin 60, and the outer leads 18 are located outside the encapsulation resin 60. In FIG. 1A, the rectangle in broken lines extending around the distal portions of the outer leads 18 and the basal portions of the support bars 14 indicates cutting lines used when separating (trimming) semiconductor devices after the encapsulation resin 60 is formed on the lead frame 10, on which the semiconductor element 50 is mounted. The portion of the frame base 11 (inner frames 19 and the like) located outside the rectangle in broken lines is disposed of when the semiconductor device is manufactured.

Figure 1B:
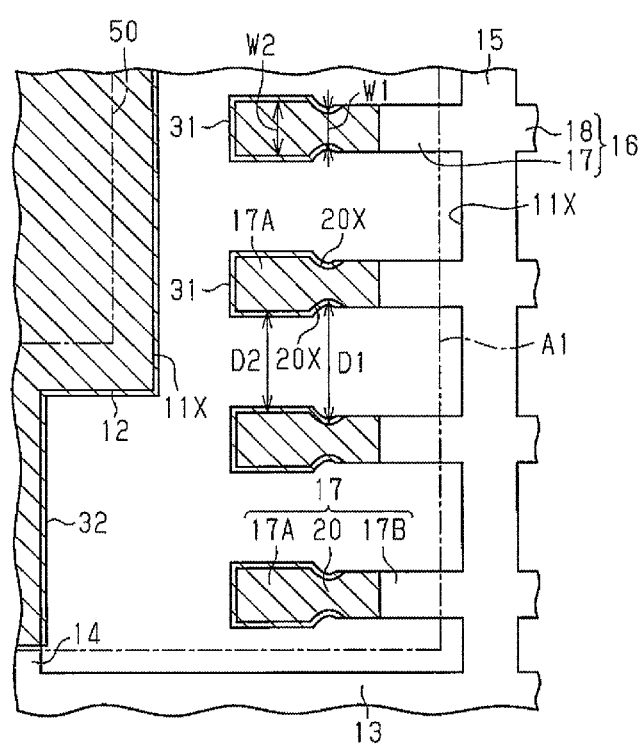
FIG. 1B is an enlarged, partial plan view of the lead frame illustrated in FIG. 1A.

Referring to FIG. 1B, each inner lead 17 is rectangular in a plan view. A longitudinally middle portion of each inner lead 17 includes a constricted portion 20. In the present example, each inner lead 17 includes a distal portion 17A at the side closer to the die pad 12, a basal portion 17B located at the side closer to the dam bar 15, and an intermediate portion connecting the distal portion 17A and the basal portion 17B and having a width that differs from a width of the distal portion 17A. In the present example, the constricted portion 20 serves as the intermediate portion. The constricted portion 20 is, for example, narrower than the other portions of the inner lead 17 (i.e., distal portion 17A and basal portion 17B). The width W1 of the constricted portion 20 is set to be smaller than the width W2 of the distal portion 17A. The widths W1 and W2 are dimensions measured in a direction perpendicular to the extending direction of the inner lead 17 in a plan view. In the present example, each of the two side walls of the inner lead 17 includes a recess 20X that extends into the inner lead 17. The narrow portion between the two recesses 20X of the inner lead 17 defines the constricted portion 20. The distance D1 between the constricted portions 20 of adjacent inner leads 17 is longer than the distance D2 between the distal portions 17A of the adjacent inner leads 17. In the present example, the wall surface of each recess 20X (i.e., each side surface of constricted portion 20) is curved in a plan view. For example, each recess 20X is semi-circular in a plan view.

Although not illustrated in the drawings, the portion (corner) connecting the constricted portion 20 and the basal portion 17B is sharper (more angled) than the portion (corner) connecting the constricted portion 20 and the distal portion 17A. The constricted portion 20 is located in the resin encapsulation area A1.

Figure 2A:
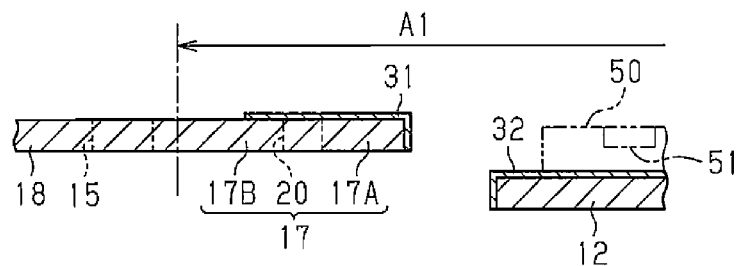
FIG. 2A is a cross-sectional view taken along line 2a-2a in FIG. 1A.

Referring to FIG. 2A, the distal portion 17A of the inner lead 17 includes an upper surface covered by the plating layer 31. The plating layer 31, for example, entirely covers the upper surface and the side surfaces of the distal portion 17A of the inner lead 17.

Figure 3:
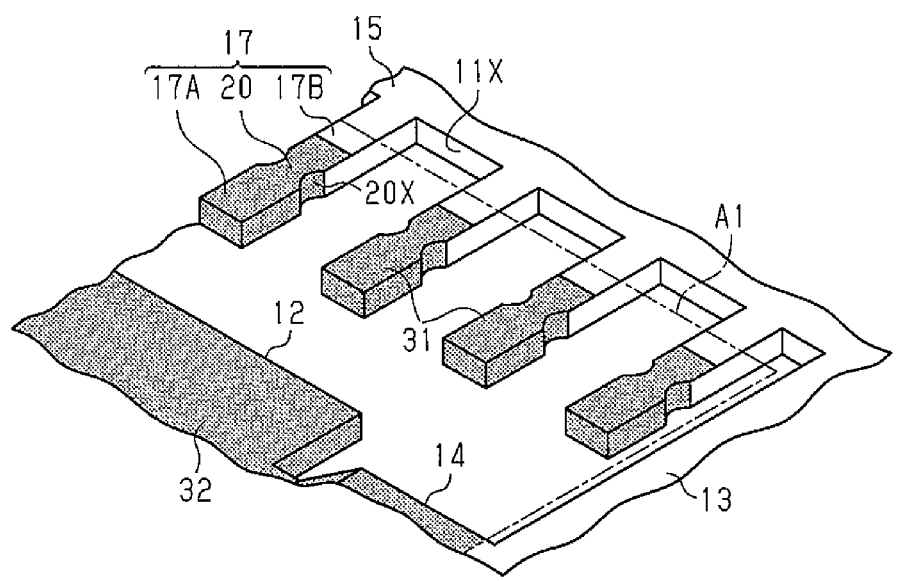
FIG. 3 is a schematic perspective view of the lead frame illustrated in FIG. 1B.

Referring to FIGS. 1B and 3, in the present example, the plating layer 31 (refer to shaded region in FIG. 3) entirely covers the upper surface and the side surfaces of the constricted portion 20. That is, the plating layer 31 entirely covers the wall surface of each recess 20X. Further, in the present example, the plating layer 31 partially covers the upper surface of the basal portion 17B of the inner lead 17 in the resin encapsulation area A1. The remaining part of the upper surface of the basal portion 17B and the entire side surfaces of the basal portion 17B are free from the plating layer 31. That is, the entire side surfaces of the basal portion 17B are located outside the plating layer 31 and exposed to the outside. The entire side surfaces of the dam bar 15 are also free from the plating layer 31. In this manner, the plating layer 31 is formed only in the resin encapsulation area A1. However, the plating layer 31 is not formed on the lower surface of the inner lead 17. That is, the lower surface of the inner lead 17 is located outside the plating layer 31.

Referring to FIG. 1A, the upper surface of the plating layer 31 functions as a wire-bonding portion electrically connected to the semiconductor element 50 mounted on the die pad 12. The plating layer 31 may be, for example, a silver (Ag) plating layer. Further, the plating layer 31 may be a multi-layer plating layer obtained by sequentially forming a nickel (Ni) plating layer, a palladium (Pd) plating layer, and a gold (Au) plating layer on the surface of the inner lead 17.

Figure 2B:
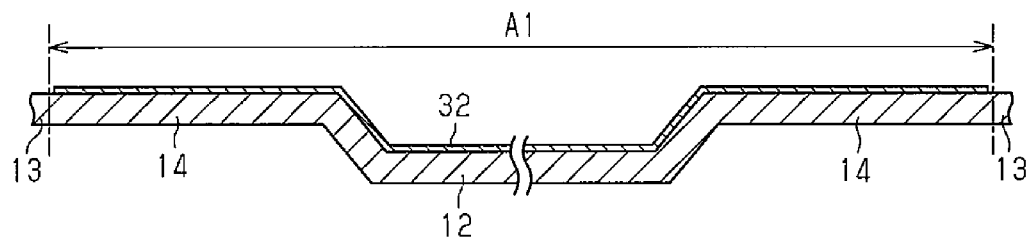
FIG. 2B is a cross-sectional view taken along line 2b-2b in FIG. 1A.

Referring to FIGS. 2A and 2B, the upper surface of the die pad 12 is covered by a plating layer 32. The plating layer 32, for example, entirely covers the upper surface and the side surfaces of the die pad 12. Further, the plating layer 32, for example, partially covers the upper surface and side surfaces of each support bar 14 supporting the die pad 12. The plating layer 32 is formed on, for example, the upper surface and the side surfaces of each support bar 14 inside the resin encapsulation area A1. However, the plating layer 32 is not formed on the lower surface of the die pad 12 and the lower surface of each support bar 14. That is, the lower surface of the die pad 12 and the lower surface of each support bar 14 are located outside the plating layer 32.

The upper surface of the plating layer 32 functions as a die-bonding portion on which the semiconductor element 50 is mounted. The plating layer 32 may be, for example, similar to the plating layer 31. That is, the plating layer 32 may be an Ag plating layer or a multi-layer plating layer obtained by sequentially forming an Ni plating layer, a Pd plating layer, and an Au plating layer.

Referring to FIGS. 2A and 2B, each support bar 14 is, for example, bent so that the die pad 12 is located at a lower position than the inner leads 17. This improves the connectivity of electrodes 51 of the semiconductor element 50, which is mounted on the die pad 12, and the inner leads 17.

A semiconductor device 40 that uses the lead frame 10 will now be described with reference to FIGS. 4 and 5.

Figure 4:
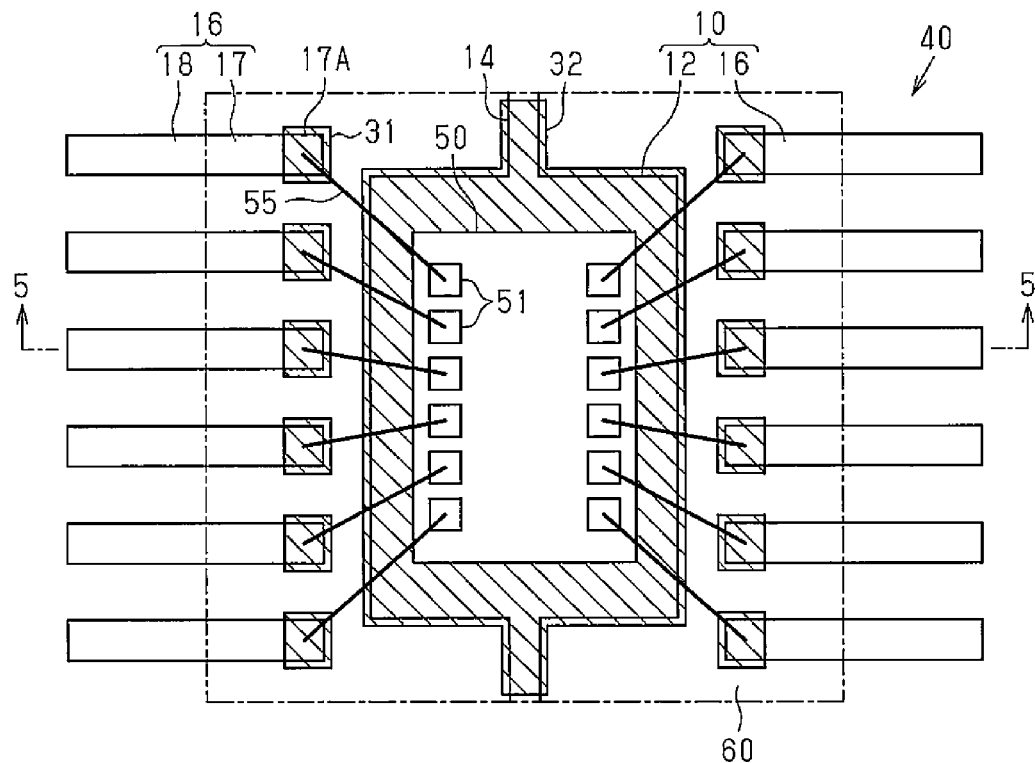
FIG. 4 is a schematic plan view illustrating one embodiment of a semiconductor device.

Referring to FIG. 4, the semiconductor device 40 is formed using the lead frame 10 and has, for example, an SOP structure.

The rear surface of the semiconductor element 50 is adhered by an adhesive (not illustrated) to the upper surface of the plating layer 32 formed on the upper surface of the die pad 12. For example, a silver paste may be used as the adhesive.

Metal wires 55 connect the electrodes 51 of the semiconductor element 50 to the plating layer 31 formed on the upper surface of the distal portion 17A of each inner lead 17. Fine wires of, for example, gold, copper, or aluminum (Al) may be used as the metal wires 55.

The portions of the dam bars 15 (refer to FIG. 1A) connecting adjacent leads 16 are removed from the lead frame 10 of the semiconductor device 40. Thus, the leads 16 are separated and electrically independent from one another.

Referring to FIG. 5, the encapsulation resin 60 encapsulates the section of the semiconductor device 40 including the semiconductor element 50, the metal wires 55, the die pad 12, and the distal portions 17A of the inner leads 17. The encapsulation resin 60 entirely encapsulates the semiconductor element 50 and the metal wires 55 on the lead frame 10. The encapsulation resin 60 covers the entire surface of the plating layer 32 formed on the die pad 12 and the support bars 14 (refer to FIG. 4), the entire surface of the plating layer 31 formed on the inner leads 17, and the upper surface and side surfaces of each inner lead 17 located outside the plating layer 31. The recesses 20X of each inner lead 17, which is illustrated in FIG. 1B, are filled with the encapsulation resin 60. Thus, the encapsulation resin 60 enters the recesses 20X, which are located at the outer side of each distal portion 17A as illustrated in FIG. 1B, and holds each lead 16. This restricts separation of the lead 16 from the encapsulation resin 60. Further, the encapsulation resin 60 entirely covers the lower surface of the die pad 12 and covers part of the lower surface of each inner lead 17 and the lower surface of each support bar 14.

Each outer lead 18 and the basal portion of each inner lead 17 are located outside the encapsulation resin 60 in the semiconductor device 40. The plating layers 31 and 32 are not located outside the encapsulation resin 60. That is, the plating layers 31 and 32 are formed only in the encapsulation resin area A1.

The semiconductor element 50 is, for example, an LSI chip. In the example of FIG. 5, a single semiconductor element 50 is mounted on the lead frame 10. However, two or more semiconductor elements 50 may be mounted on the lead frame 10 when necessary. Further, any active element or passive element may be used instead of the semiconductor element 50 or in combination with the semiconductor element 50. The encapsulation resin 60 may be an insulative resin such as an epoxy resin, a polyimide resin, a phenol resin, or an acrylic resin.

Each outer lead 18 of the semiconductor device 40 includes bent portions 21 and 22. The bent portions 21 and 22 result in the outer lead 18 having a gull-wing shape. The bent portion 21 is located at a given location, for example, where the dam bar 15 (refer to FIG. 1A) was located. The lower surface of the outer lead 18 from the bent portion 22 to the distal end of the outer lead 18 serves as a mounting surface that is soldered to a pad of a mounting substrate such as a printed wiring board.

A method for manufacturing the lead frame 10 will now be described.

Figure 6A:
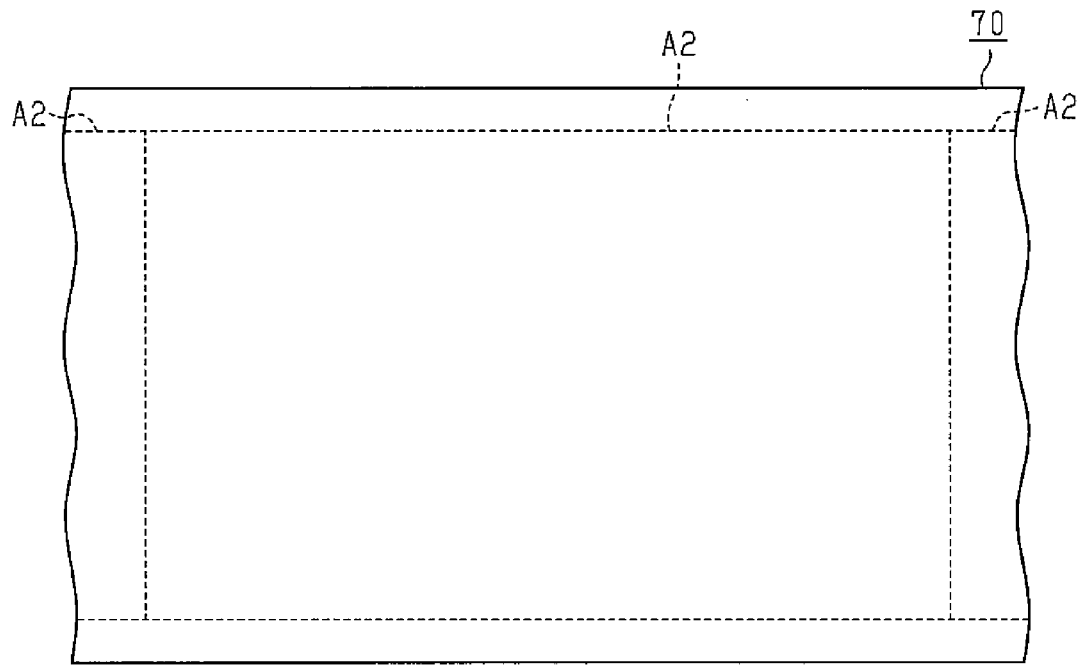
FIGS. 6A and 6B are schematic plan views illustrating a method for manufacturing the lead frame of FIG. 1A.

Referring to FIG. 6A, a metal plate 70 is prepared. The metal plate 70 is, for example, rectangular in a plan view. The metal plate 70 includes a plurality of (three in the example of FIG. 6A) independent regions A2 that are arranged continuously. The lead frame 10 (refer to FIG. 1A) is formed in each independent region A2. The material of the metal plate 70 may be, for example, Cu, a Cu-based alloy, Fe—Ni, an Fe—Ni-based alloy, or the like. The metal plate 70 may be an elongated strip of a hoop material.

In the example illustrated in FIG. 6A, the metal plate 70 includes three independent regions A2. However, the number of the independent regions A2 is not particularly limited. The description hereafter will focus on only one independent region A2.

Figure 6B:
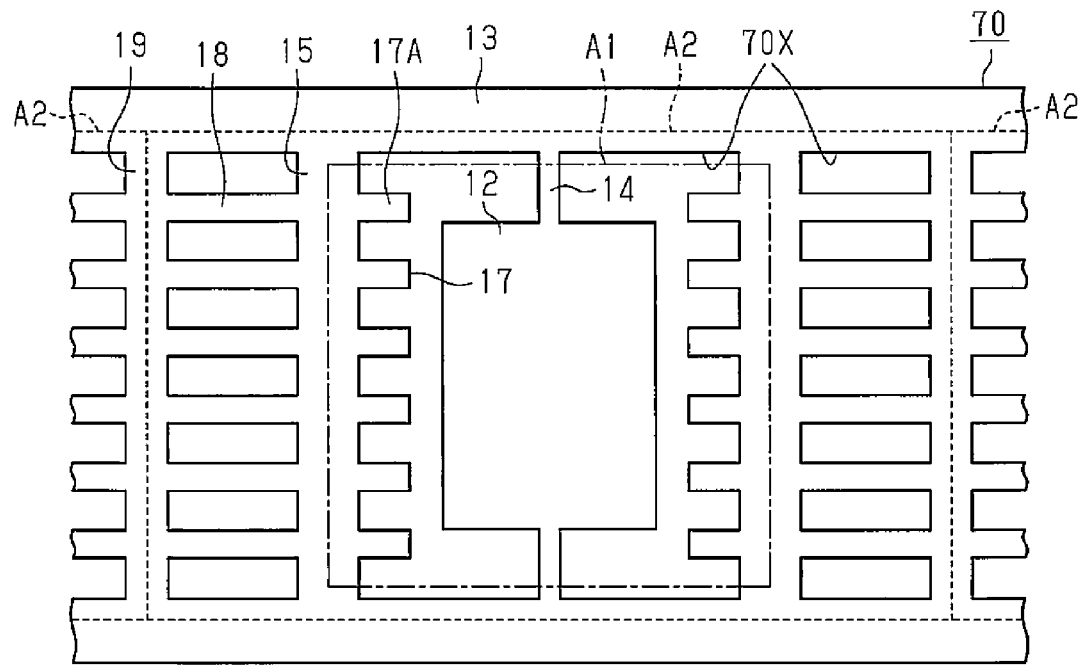

In the step of FIG. 6B, the metal plate 70 undergoes stamping to form openings 70X (first openings) that define the die pad 12, the two rails 13, the support bars 14, the dam bars 15, the distal portions 17A of the inner leads 17, the outer leads 18, and the inner frame 19. In this step, a coining process is performed on the distal portions 17A of the inner leads 17 simultaneously with or subsequent to the formation of the openings 70X. A plating layer (e.g., Ag plating layer) is not formed on the distal portions 17A when the coining process is performed. Thus, there is no plating layer of which the crystal structure would be changed by the coining process.

Further, this step forms only the part of each inner lead 17 illustrated in FIG. 1B that includes the distal portions 17A, which undergoes the coining process. Thus, in this step, the basal portions 17B (refer to FIG. 1B) of the inner leads 17 are not formed, and the dam bars 15 are increased in width from the dam bars 15 illustrated in FIG. 1B by the basal portions 17B of the inner leads 17 that are not formed.

Figure 7A:
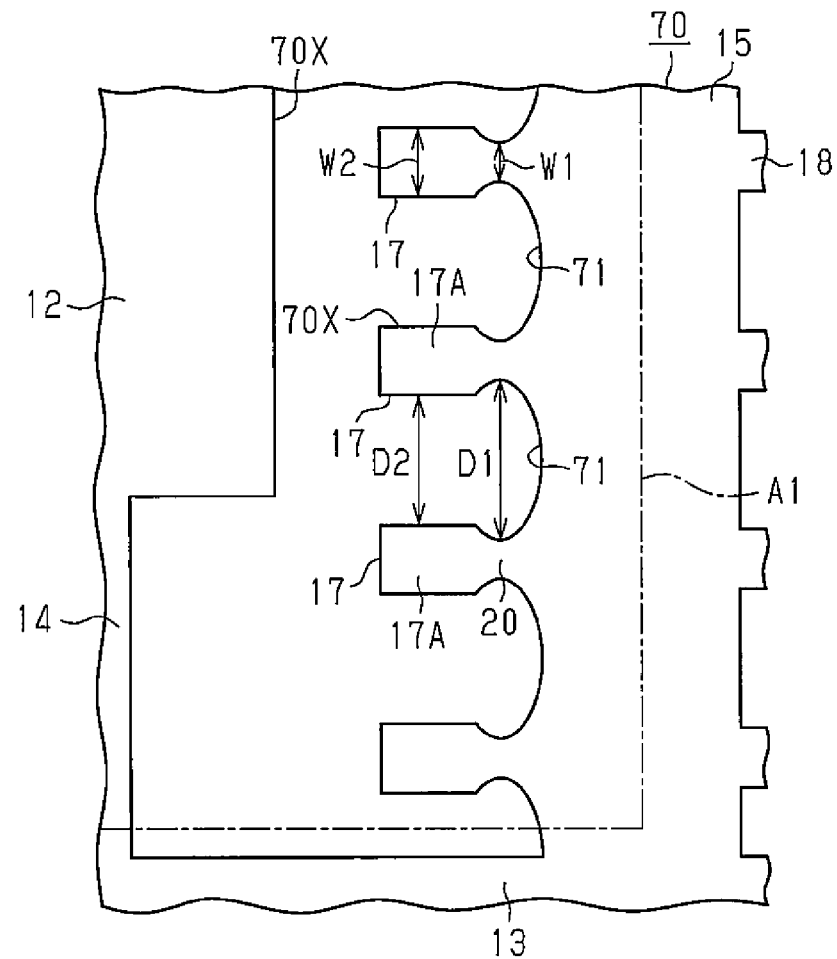
FIG. 7A is an enlarged plan view illustrating the method for manufacturing the lead frame of FIG. 1A.

Referring to FIG. 7A, the opening 70X sets the distance (width) between the die pad 12 and the distal portion 17A of each inner lead 17. Further, the opening 70X sets the distance D2 between adjacent distal portions 17A. The opening 70X between the adjacent distal portions 17A includes an expanded portion 71 near the corresponding dam bar 15. The expanded portion 71 is larger than the other parts of the opening 70X (e.g., portion defining the adjacent distal portions 17A). The expanded portion 71 is recessed from the distal portions 17A toward the dam bar 15. The distance D1 between the adjacent inner leads 17 where the expanded portion 71 is located is greater than the distance D2. In the present example, the expanded portion 71 is curved in a plan view. For example, the expanded portion 71 is elliptical in a plan view. The expanded portion 71 defines the constricted portion 20, the width W1 of which is smaller than the width W2 of the distal portion 17A. The expanded portion 71 is formed inside the resin encapsulation area A1 (refer to single-dashed lines).

The openings 70X are formed, for example, as described below.

Figure 7B:
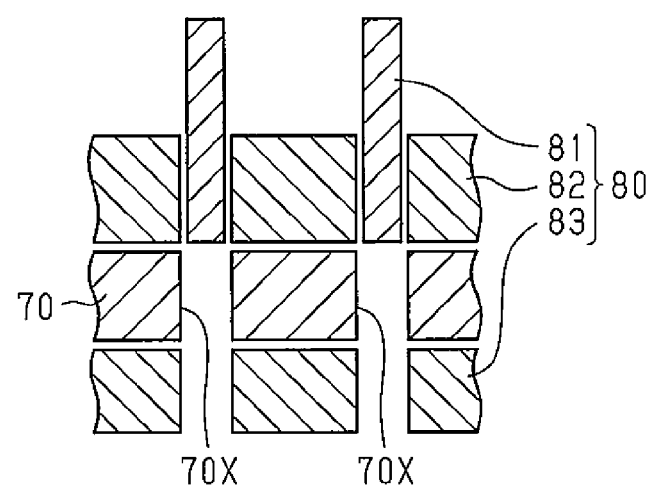
FIG. 7B is a schematic cross-sectional view illustrating the method for manufacturing the lead frame of FIG. 1A.

Referring to FIG. 7B, a stamping tool 80 is prepared. The stamping tool 80 mainly includes punches 81, a holder 82, and a die 83. The metal plate 70 illustrated in FIG. 6A is inserted between the holder 82 and the die 83.

Then, the punches 81 press and punch out given portions of the metal plate 70 to form the openings 70X. FIG. 7B illustrates a situation after the punches 81 punch out given locations of the metal plate 70.

Figure 8A:
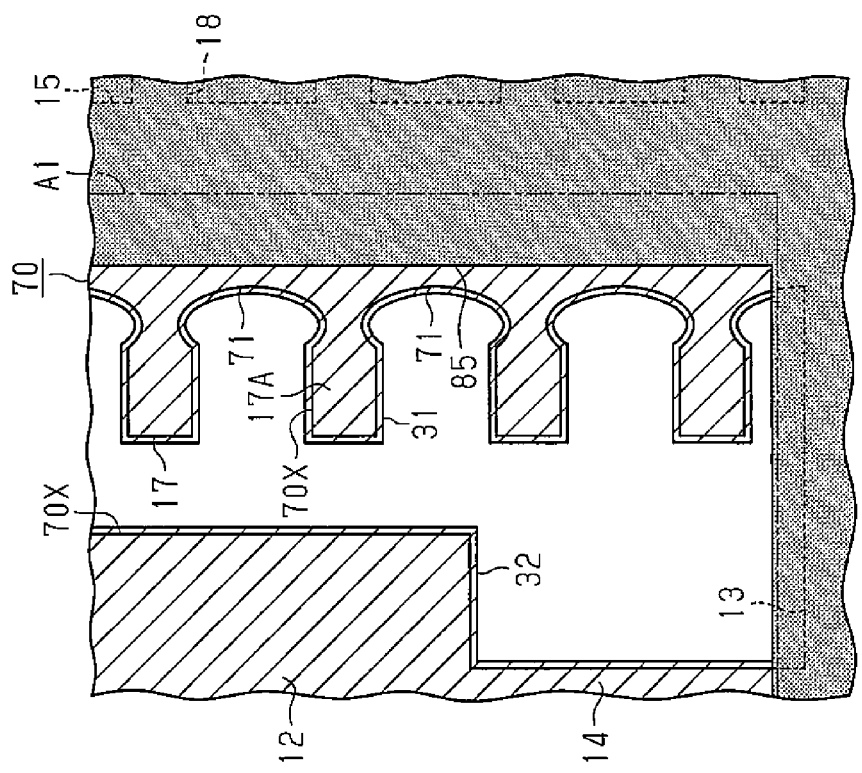

In the step of FIG. 8A, a mask 85 is formed on the upper surface of the metal plate 70. The mask 85 exposes the die pad 12, parts of the inner leads 17 including the distal portions 17A, and parts of the support bars 14. In the present example, the mask 85 exposes the parts of the inner leads 17, the parts of the support bars 14, and the entire surface of the die pad 12 inside the resin encapsulation area A1 (refer to single-dashed lines). In other words, the mask 85 covers the upper surface of the metal plate 70 outside the resin encapsulation area A1. The material of the mask 85 is not particularly limited as long as the material is resistant to plating when a plating process is performed in the next step.

Figure 8B:
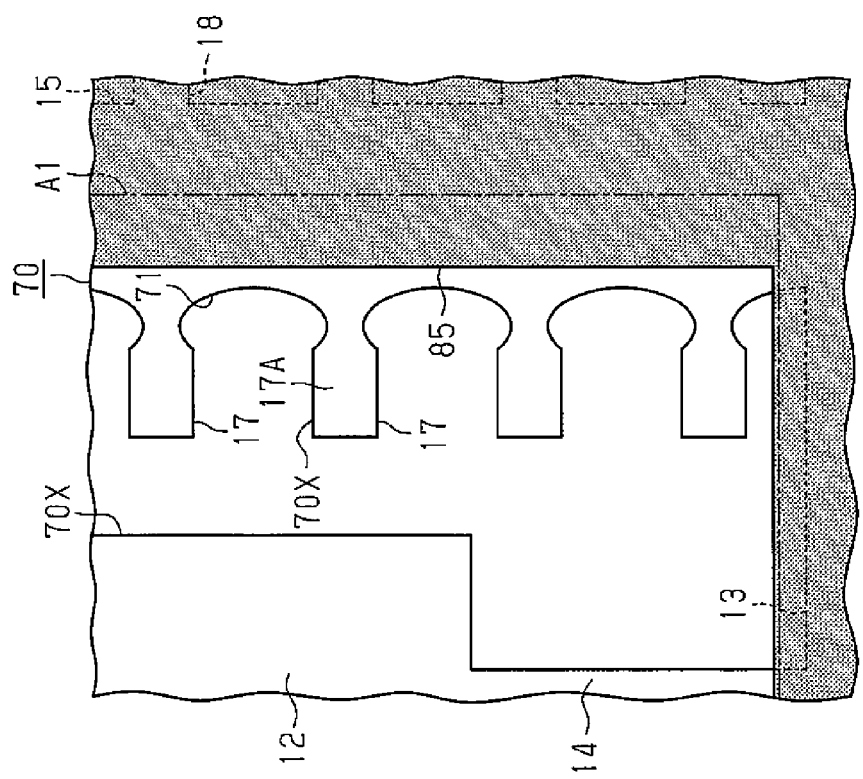

In the step of FIG. 8B, electrolytic plating is performed on the upper surface of the metal plate 70 using the mask 85 as a plating mask and the metal plate 70 as a plating power supplying layer. This plates the upper surface of the metal plate 70 that is exposed to the outside from the mask 85. In the present example, the plating layer 32 is formed on the upper surface of the die pad 12, and the plating layer 31 is formed on the upper surface of the distal portion 17A of each inner lead 17. For example, when the plating layers 31 and 32 are Ag plating layers, Ag plating liquid is sprayed onto the upper surface of the metal plate 70 to form the plating layers 31 and 32. The Ag plating layer is also applied to the side surfaces of the metal plate 70 (e.g., die pad 12, support bars 14, and inner leads 17). Thus, the plating layer 32 covers the side surfaces of the die pad 12 in addition to the upper surface of the die pad 12. Further, the plating layer 31 covers the side surfaces of the distal portion 17A of each inner lead 17 in addition to the upper surface of the distal portion 17A. The plating layer 31 also covers the wall surfaces of the expanded portions 71. In the present example, the edge of the mask 85 is located at the outer side of the expanded portions 71. Thus, the plating layer 31 also covers parts of the metal plate 70 located at the outer side of the expanded portions 71. The edge of the mask 85 is located inside the resin encapsulation area A1. Thus, the plating layers 31 and 32 are formed only in the resin encapsulation area A1. In the plating step, electrolytic plating is performed with the lower surface of the metal plate 70 entirely coverd by a mask (not illustrated). Thus, a plating layer is not formed on the lower surface of the metal plate 70. The mask 85 is removed after the plating layers 31 and 32 are formed in this manner.

In the steps of FIGS. 9A and 9B, stamping is performed to form openings 70Y (second openings) that define the basal portions 17B of the inner leads 17. Although not illustrated in the drawings, in the same manner as the stamping tool 80 illustrated in FIG. 7B, the stamping tool includes punches 86, a holder, and a die. The metal plate 70 including the openings 70X is inserted in the stamping tool between the holder and the die. Then, the punches 86 press and punch out given portions of the metal plate 70. This forms the openings 70Y that are in communication with the expanded portions 71 of the openings 70X and define the dam bars 15 and the basal portions 17B of the inner leads 17, as illustrated in FIG. 9B. Each opening 70Y sets the distance D3 between adjacent basal portions 17B. The distance D3 may be the same as the distance D2 between adjacent distal portions 17A. Alternatively, the distance D3 may be longer than the distance D2 between adjacent distal portions 17A but shorter than the distance D1 between adjacent constricted portions 20.

The formation of the openings 70Y partially remove the wall surfaces of the expanded portions 71, and the remaining wall surfaces of the expanded portions 71 define the recesses 20X. The constricted portions 20 defined by the recesses 20X connect the basal portions 17B to the distal portions 17A. The formation of the basal portions 17B forms the inner leads 17. This forms the leads 16, each including the inner lead 17 and the outer lead 18. In other words, the steps of FIGS. 9A and 9B form the openings 11X, which include the openings 70Y and the openings 70X that are in communication with each other. This forms the frame base 11.

As illustrated in FIG. 9A, the punches 86 are arranged over parts of the wall surfaces of the expanded portions 71 in a plan view. In the present example, each punch 86 is rectangular in a plan view. Each punch 86 includes end surfaces 86A that set the length of the basal portions 17B. The end surfaces 86A (lateral end surfaces in FIG. 9A) are arranged to intersect the curved wall surfaces of the corresponding expanded portions 71 in a plan view. Each punch 86 includes an end surface 86B that is orthogonal to the end surfaces 86A and has a width set in conformance with the distance D3, which is indicated in FIG. 9B. The width of the end surface 86B is smaller than the width of the expanded portion 71 (refer to distance D1). This reduces burrs or the like formed at the boundary between the wall surface of the opening 70X and the wall surface of the opening 70Y even when the punch 86 is displaced from the intended position.

In the steps illustrated in FIGS. 9A and 9B, the punches 86 punch out portions of the metal plate 70 that include parts of the wall surfaces of the expanded portions 71 to which the plating layer 31 is applied and form the openings 70Y illustrated in FIG. 9B. Thus, the wall surface of each opening 70Y, that is, the side surfaces of the basal portion 17B of each inner lead 17 and the side surfaces of each dam bar 15 are free from the plating layer 31. The plating layer 31 is formed on part of the upper surface of the basal portion 17B of each inner lead 17. In the present example, the location of the end of the plating layer 31 formed on the upper surface of each inner lead 17 is separated from the location of the end of the plating layer 31 formed on each side surface of the inner lead 17. The end of the plating layer 31 formed on each side surface of the inner lead 17 is located at the boundary of the wall surface of the opening 70X and the wall surface of the openings 70Y, that is, the end of the recess 20X that is closer to the basal portion 17B. The plating layer 31 is formed on the side surfaces of each distal portion 17A and the side surfaces of each constricted portion 20 that correspond to the wall surface of the opening 70X. However, the plating layer 31 is not formed on the side surfaces of each basal portion 17B that correspond to the wall surface of the opening 70Y.

Figure 10A:
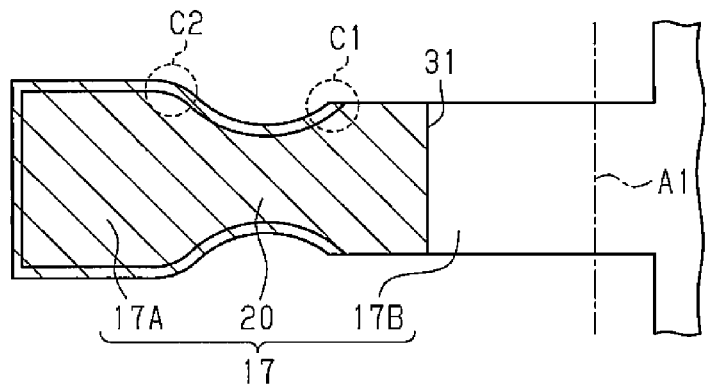

The end surface 86A of each punch 86, which extends straight in a plan view, forms the connecting portion (corner) of the side surface of the corresponding constricted portion 20 and the side surface of the corresponding basal portion 17B. Thus, as illustrated in FIG. 10A, a connecting portion C1 (corner) of the side surface of the constricted portion 20 and the side surface of the basal portion 17B is formed as a sharp corner, that is, an angled corner. In contrast, a connecting portion C2 (corner) of the side surface of the constricted portion 20 and the side surface of the distal portion 17A is formed in conformance with the shape of the corner of the corresponding punch 81 (refer to FIG. 7B). Due to manufacturing reasons, it is difficult to form the punch 81 with angled corners. Thus, the punch 81 has rounded corners. Therefore, the connecting portion C2 (corner) of the side surface of the constricted portion 20 and the side surface of the distal portion 17A also has rounded corners. Consequently, the connecting portion C1 (corner) formed by the second stamping process with the punch 86 is more angled than the connecting portion C2 (corner) formed by the first stamping process with the punch 81. In this manner, when the connecting portion C1 of the side surface of the constricted portion 20 and the side surface of the basal portion 17B undergo punching to obtain the angled corner, delamination of the plating layer 31 from the upper surface of the basal portion 17B is limited when the second stamping is performed with the punch 86.

Then, stamping is performed to bend the support bars 14 so that the die pad 12 illustrated in FIG. 9B is located at a lower position than the inner leads 17.

The lead frame 10 illustrated in FIG. 1 is manufactured through the steps described above.

A method for manufacturing the semiconductor device 40 will now be described.

Figure 10B:
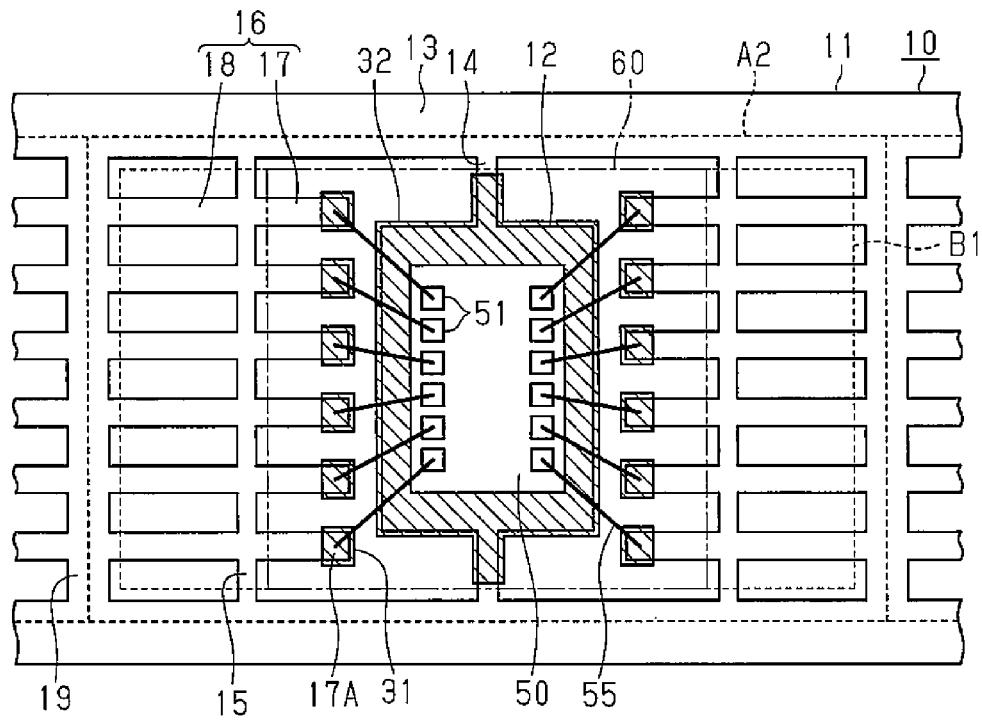
FIG. 10B is a schematic plan view illustrating a method for manufacturing the semiconductor device of FIG. 4.

First, in the step of FIG. 10B, the rear surface of the semiconductor element 50 is adhered by an adhesive (not illustrated) to the upper surface of the plating layer 32, which covers the upper surface of the die pad 12. Then, electrodes 51 of the semiconductor element 50 are electrically connected by metal wires 55 to the upper surface of the plating layer 31, which covers the upper surface of the distal portion 17A of each inner lead 17. This mounts the semiconductor element 50 on the lead frame 10. Then, the encapsulation resin 60 (refer to single-dashed lines) is formed to encapsulate the semiconductor element 50, the metal wires 55, the die pad 12, the inner leads 17, and the plating layers 31 and 32. The encapsulation resin 60 may be formed through transfer molding, compression molding, injection molding, or the like.

Figure 10C:
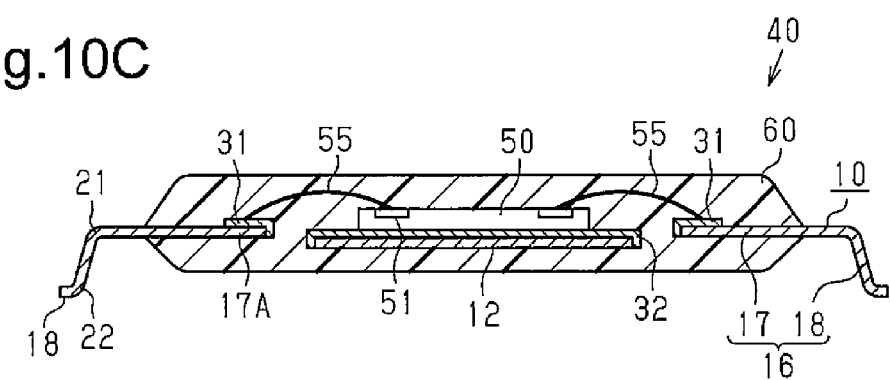
FIG. 10C is a schematic cross-sectional view illustrating a method for manufacturing the semiconductor device of FIG. 4.

Then, stamping or the like is performed to remove (cut out) portions of the dam bars 15 connecting the adjacent leads 16 to each other. Further, stamping or the like is performed to separate the distal ends of the outer leads 18 and the ends of the support bars 14 from the inner frames 19 and the rails 13 along cutting lines B1 indicated by broken lines. In the step of FIG. 10C, the outer leads 18 are bent to form the bent portions 21 and 22 on the outer leads 18.

The manufacturing steps described above manufacture the semiconductor device 40 illustrated in FIGS. 4 and 5.

The present embodiment has the advantages described below.

(1) Stamping is performed to form the openings 70X that define the distal portions 17A of the inner leads 17. After the distal portions 17A undergo a coining process, the plating layer 31 is formed covering the upper surface and side surfaces of each distal portion 17A. In this method, the coining process is not performed after the plating layer 31 is formed. Thus, changes in the crystal structure of the plating layer 31 are limited. This reduces connection failures of the metal wires 55 and keeps the bonding strength sufficient. In other words, the wire-bonding characteristics are improved from the prior art.

Figure 13A:
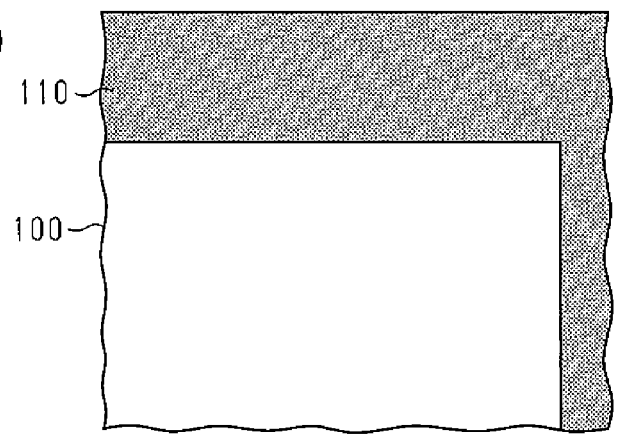
FIGS. 13A to 13C are schematic plan views illustrating a method for manufacturing a lead frame in the related art.
Figure 13B:
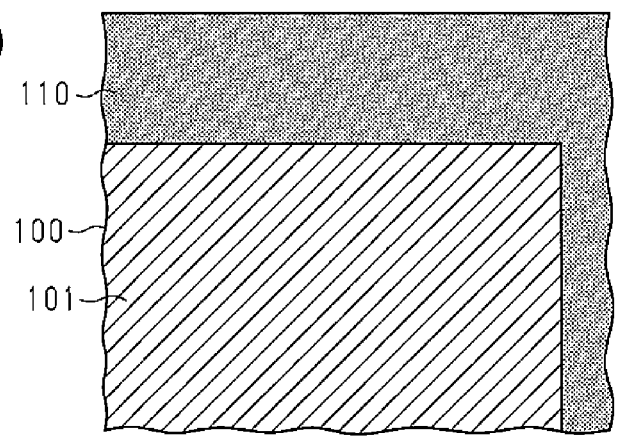
Figure 13C:
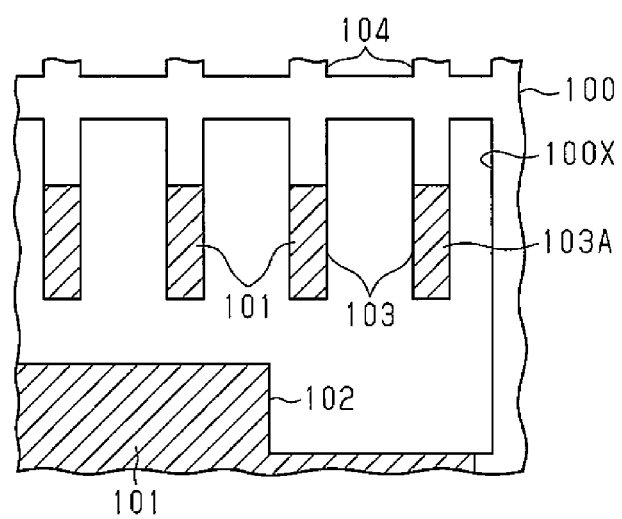

In the related art, as illustrated in FIGS. 13A to 13C, when forming the plating layer 101 on the flat metal plate 100 before forming the inner leads 17, it is difficult to manage the region in which the plating layer 101 is formed. In contrast, the present embodiment first partially forms the inner lead 17, that is, the distal portion 17A on which the plating layer 31 is formed before forming the plating layer 31 on the distal portions 17A. This facilitates the management of the region in which the plating layer 31 is formed as compared with the related art.

(2) After the plating layer 31 is formed, stamping is performed to form the openings 70Y that define the basal portions 17B of the inner leads 17. Thus, the plating layer 31 is not formed on the side surfaces of the basal portion 17B of each inner lead 17.

For example, when the plating layer 31 is exposed to the outside from the resin encapsulation area A1, the plating layer 31 would be located outside the encapsulation resin 60 when manufacturing the semiconductor device with the lead frame that includes the plating layer 31. This may induce migration and electrically short-circuit adjacent leads 16. This problem becomes prominent when the plating layer 31 is an Ag plating layer.

In contrast, the present embodiment forms the basal portions 17B of the inner leads 17 after forming the plating layer 31, which functions as a wire-bonding portion, on the distal portions 17A of the inner leads 17. Thus, the plating layer 31 is not formed on the side surfaces of the basal portion 17B. Further, the plating layer 31 is not formed outside the resin encapsulation area A1. This reduces short-circuiting of adjacent leads 16 that would be caused by migration.

(3) The first stamping process forms the expanded portions 71 and the openings 70X with the punches 81. The second stamping process forms the openings 70Y, which are in communication with the openings 70X, with the punches 86, which are narrower than the expanded portions 71. This reduces burrs or the like formed at the boundary between the wall surface of each opening 70X and the wall surface of the corresponding opening 70Y even when the corresponding punch 86 is displaced from the intended position.

(4) Each inner lead 17 includes the constricted portion 20, which is narrower than the distal portion 17A and connects the distal portion 17A and the basal portion 17B of the inner lead 17. In this structure, the encapsulation resin 60 is anchored to the constricted portion 20. This restricts separation of the leads 16 from the encapsulation resin 60.

It should be apparent to those skilled in the art that the foregoing embodiments may be employed in many other specific forms without departing from the spirit or scope of this disclosure. Particularly, it should be understood that the foregoing embodiments may be employed in the following forms.

In the above embodiment, the shape of the inner leads 17 is not particularly limited.

Figure 11A:
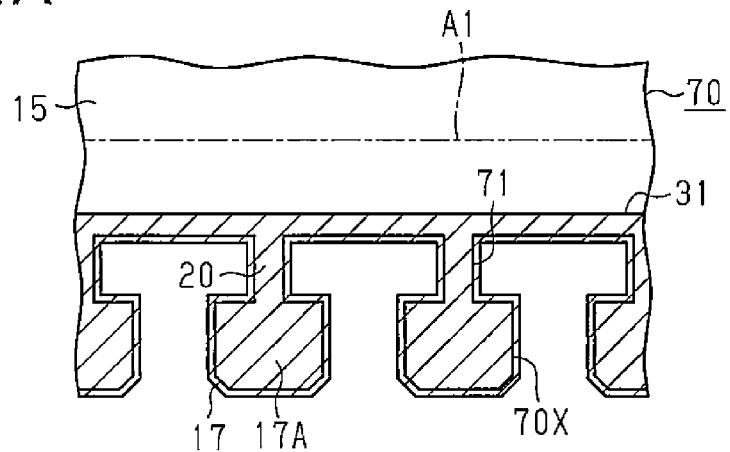
FIGS. 11A to 11C are enlarged plan views illustrating a method for manufacturing a modified example of a lead frame.
Figure 11B:
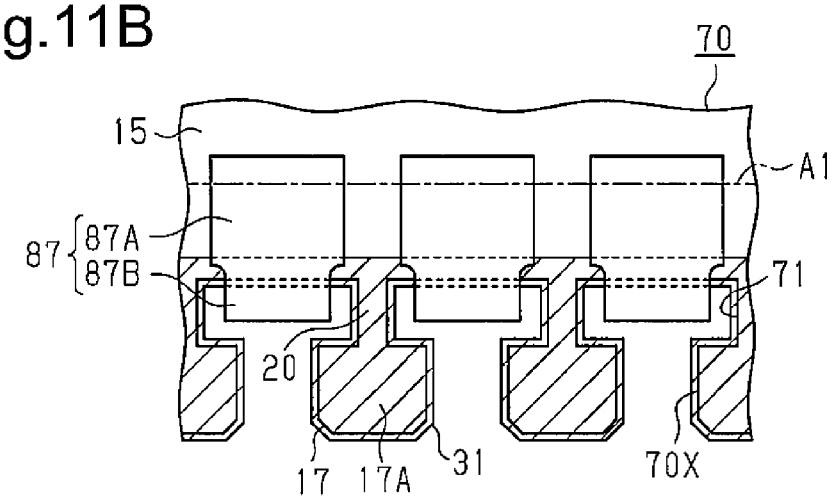
Figure 11C:
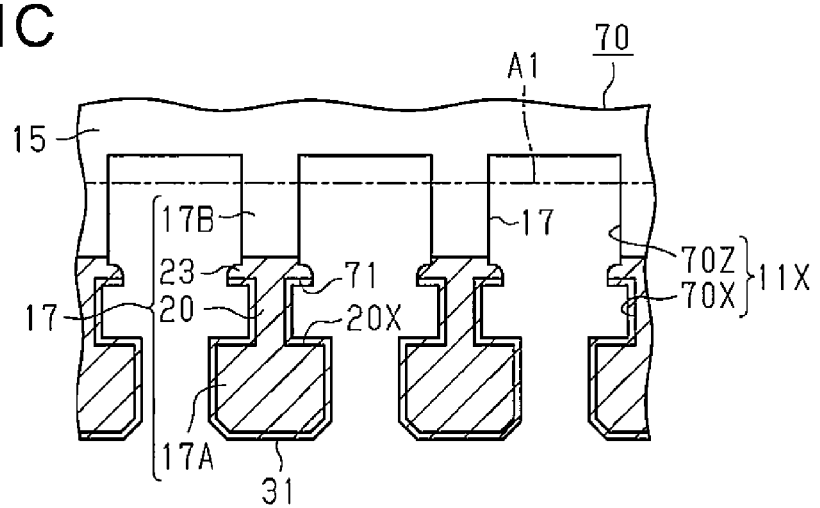

For example, the inner leads 17 may be formed through the manufacturing steps illustrated in FIGS. 11A to 11C. In this case, the method for manufacturing portions other than the inner leads 17 is the same as the above embodiment. Thus, the description will focus on only the inner leads 17.

In the step of FIG. 11A, stamping is performed to form the openings 70X (first openings) that define the distal portions 17A of the inner leads 17 in the metal plate 70. This also forms the expanded portion 71 at the end of each opening 70X that is closer to the dam bar 15. The expanded portion 71 is larger than the portion of the opening 70X defining the distal portion 17A. In the present example, the expanded portion 71 is rectangular in a plan view. The expanded portion 71 defines the constricted portion 20.

Then, in the same manner as the steps illustrated in FIGS. 8A and 8B, the plating layer 31 is formed covering the upper surface and the side surfaces of a portion of the metal plate 70 including the distal portion 17A of each inner lead 17. In the present example, the plating layer 31 covers the entire upper surface and each entire side surface of each distal portion 17A, the entire wall surface of each expanded portion 71, and the upper surface of the metal plate 70 near the expanded portions 71. The present example also has the plating layer 31 formed only in the resin encapsulation area A1.

In the steps of FIGS. 11B and 11C, stamping is performed using punches 87 to form openings 70Z (second openings) defining the basal portions 17B of the inner leads 17. As illustrated in FIG. 11B, the punches 87 are arranged over parts of the wall surfaces of the expanded portions 71 in a plan view. In the present example, each punch 87 includes a main body 87A, which is rectangular in a plan view, and a projection 87B, which projects from the main body 87A. The projection 87B has a smaller width than the main body 87A. The main body 87A and the projection 87B have a stepped form in a plan view. The punch 87 is arranged so that the end surface of the projection 87B (end surface extending in vertical direction in FIG. 11B) intersects the wall surface of the expanded portion 71 (wall surface extending in lateral direction in FIG. 11B). Here, the width of the projection 87B is smaller than the width of the expanded portion 71. This reduces burrs or the like formed at the boundary between the wall surface of the opening 70X and the wall surface of the opening 70Z even when the punch 87 is displaced from the intended position.

Further, the punches 87 press and punch out given portions of the metal plate 70 to form openings 70Z that are in communication with the expanded portions 71 of the openings 70X and define the basal portions 17B of the inner lead 17, as illustrated in FIG. 11C. The formation of the openings 70Z partially removes the wall surfaces of the expanded portions 71, and the remaining wall surfaces of the expanded portions 71 define the recesses 20X. In the present example, each recess 20X is U-shaped in a plan view, and each corner of the recess 20X is formed at a right angle. Further, the formation of the openings 70Z forms a wide portion 23 between each constricted portion 20 and the corresponding basal portion 17B. The wide portion 23 has a larger width than the basal portion 17B and is shaped in conformance with the stepped form of the punch 87 (refer to FIG. 11B). In this manner, in the inner lead 17 illustrated in FIG. 11C, the intermediate portion connecting the distal portion 17A and the basal portion 17B includes the constricted portion 20 and the wide portion 23. The constricted portion 20 is connected to the distal portion 17A and narrower than the distal portion 17A. Further, in the present example, the constricted portion 20 is narrower than the basal portion 17B. The wide portion 23 connects the constricted portion 20 to the basal portion 17B and is wider than the basal portion 17B. In the present example, the wide portion 23 is narrower than the distal portion 17A. In this manner, in the steps of FIGS. 11B and 11C, the punches 87 punch out given portions of the metal plate 70 to form the openings 70Z so that the constricted portions 20, which have a smaller width than the distal portions 17A (in present example, smaller width than basal portions 171B), and the wide portions 23, which have a larger width than the basal portions 17B (in present example, smaller width than distal portions 17A), connect the distal portions 17A and the basal portions 17B.

In the present example, the wall surface of each recess 20X includes the side surface of the corresponding constricted portion 20, part of the side surface of the corresponding distal portion 17A (portion that contacts side surface of constricted portion 20 and extends toward adjacent inner lead 17 from side surface of constricted portion 20), and part of the side surface of the corresponding wide portion 23 (portion that contacts side surface of constricted portion 20 and extends outward or toward adjacent inner lead 17 from side surface of constricted portion 20). The plating layer 31 covers the entire wall surface of the recess 20X. Accordingly, the plating layer 31 covers the entire side surface of the wide portion 23 that defines the wall surface of the recess 20X.

The plating layer 31 is not formed on the side surfaces of the wide portions 23 obtained by the punches 87, that is, the side surface of each wide portion 23 connecting the wall surface of the corresponding recess 20X and the side surface of the corresponding basal portion 17B. Further, the plating layer 31 is also not formed on the side surfaces of the basal portions 17B and the side surfaces of the dam bars 15. That is, the plating layer 31 is not formed on the wall surfaces of the openings 70Z obtained by the punches 87. In the example illustrated in FIG. 11C, the plating layer 31 is formed on the upper surface of each wide portion 23 and the upper surface of part of each basal portion 17B.

The lead frame including the inner leads 17 with the structure illustrated in FIG. 11C has the same advantages as the above embodiment. Further, in addition to the recess 20X, each inner lead 17 includes the wide portion 23 that has a larger width than the basal portion 17B. The encapsulation resin 60 is anchored to the two ends of the wide portion 23. This restricts separation of the leads including the inner leads 17 from the encapsulation resin 60.

Figure 12A:
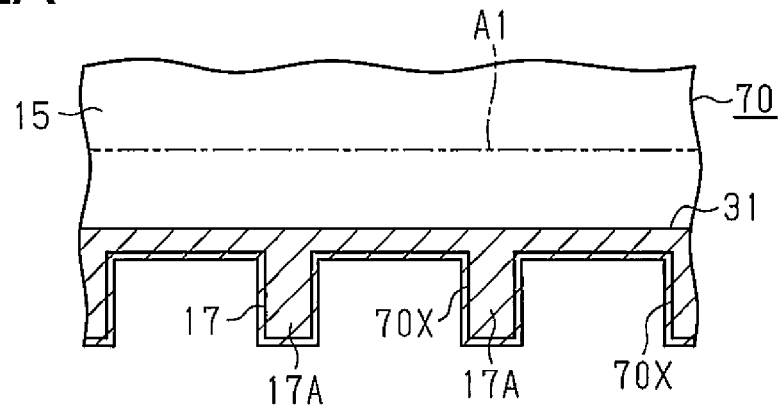
FIGS. 12A to 12C are enlarged plan views illustrating a method for manufacturing a further modified example of a lead frame.
Figure 12B:
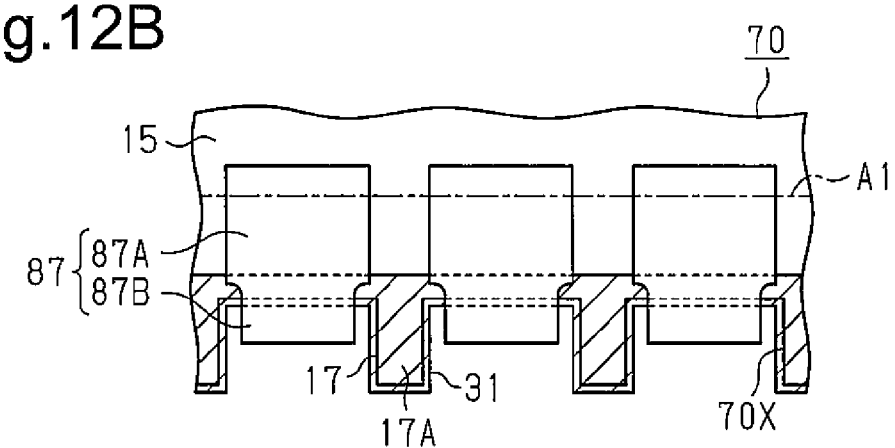
Figure 12C:
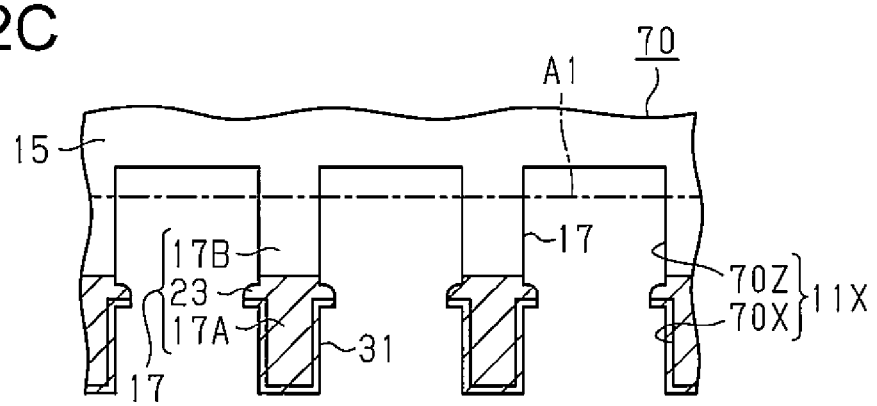

The inner leads 17 may also be formed through the manufacturing steps illustrated in FIGS. 12A to 12C. In this case, the method for manufacturing portions other than the inner leads 17 is the same as the above embodiment. Thus, the description will focus on only the inner leads 17.

In the step of FIG. 12A, stamping is performed to form the openings 70X (first openings) that define the distal portions 17A of the inner leads 17 in the metal plate 70. In this case, the expanded portion 71 is not formed at the end of each opening 70X that is closer to the dam bar 15. In the present example, the opening 70X that sets the width between adjacent distal portions 17A is rectangular in a plan view. In this step, only the distal portions 17A of the inner leads 17 are formed.

Then, in the same manner as the steps illustrated in FIGS. 8A and 8B, the plating layer 31 is formed covering the upper surface and the side surfaces of parts of the metal plate 70 including the distal portion 17A of each inner lead 17. In the present example, the plating layer 31 covers the entire upper surface and each entire side surface of each distal portion 17A, the entire wall surface of each opening 70X, and the upper surface of the metal plate 70 near the openings 70X. The present example also has the plating layer 31 formed only in the resin encapsulation area A1.

In the steps of FIGS. 12B and 12C, stamping is performed using the punches 87 to form openings 70Z (second openings) defining the basal portions 17B of the inner leads 17. As illustrated in FIG. 12B, each punch 87 is arranged so that the end surface of the projection 87B (end surface extending in vertical direction in FIG. 12B) intersects the wall surface of the corresponding opening 70X (wall surface extending in lateral direction in FIG. 12B). Here, the width of the projection 87B is smaller than the width of the opening 70X. This reduces burrs or the like formed at the boundary between the wall surface of the opening 70X and the wall surface of the opening 70Z even when the punch 87 is displaced from the intended position.

Further, the punches 87 press and punch out given portions of the metal plate 70 to form openings 70Z that are in communication with the openings 70X and define the basal portions 17B of the inner lead 70, as illustrated in FIG. 12C. The formation of the openings 70Z forms intermediate portions that connect the distal portions 17A to the basal portions 17B and have a width that differs from that of the distal portions 17A. In the present example, each intermediate portion defines a wide portion 23 that has a larger width than distal portions 17A and the basal portions 17B. The wide portion 23 is shaped in conformance with the stepped form of the punch 87 (refer to FIG. 12B). In this manner, in the steps of FIGS. 12B and 12C, the punches 87 punch out given portions of the metal plate 70 to form openings 70Z so that the wide portions 23, which have a larger width than the distal portions 17A and the basal portions 17B, connect the distal portions 17A and the basal portions 17B.

In the present example, the plating layer 31 entirely covers first side surface sections of the wide portions 23 that define the wall surfaces of the openings 70X (side surface sections contacting the side surfaces of the distal portions 17A and extending outward or toward the adjacent inner leads 17 from the side surfaces of the distal portions 17A). The plating layer 31 is not formed on second side surface sections of the wide portions 23 formed by the punches 87 and connecting the wall surfaces of the openings 70X (first side surface sections of wide portions 23) to side surfaces of the basal portions 17B. Further, the plating layer 31 is also not formed on the side surfaces of the basal portions 17B and the side surfaces of the dam bars 15. That is, the plating layer 31 is not formed on the wall surfaces of the openings 70Z formed by the punches 87. In the example illustrated in FIG. 12C, the plating layer 31 is formed on the upper surface of each wide portion 23 and the upper surface of part of each basal portion 17B.

The lead frame including the inner leads 17 with the structure illustrated in FIG. 12C has the same advantages as the above embodiment. Further, the intermediate portion of each inner lead 17 includes the wide portion 23 that has a larger width than the basal portion 17B. The encapsulation resin 60 is anchored to the two ends of the wide portion 23. This restricts separation of the leads including the inner leads 17 from the encapsulation resin 60.

In the above embodiments and modified examples, there is particularly no limitation to the formation region of the plating layer 31, which functions as a wire-bonding portion. The formation region of the plating layer 31 is not particularly limited as long as the plating layer 31 covers the upper surface and the side surface of each distal portion 17A and covers at least part of the side surface of each intermediate portion and the plating layer 31 is formed only in the resin encapsulation area A1. For example, in each of the above embodiments, the plating layer 31 is formed so as to cover a region extending from the upper surfaces of the distal portions 17A to parts of the upper surfaces of the basal portions 17B. However, the plating layer 31 may be formed to cover a region extending from the upper surfaces of the distal portions 17A to the upper surfaces of parts of the intermediate portions (e.g., in the first embodiment, constricted portions 20). Further, in the above embodiment, the plating layer 31 entirely covers the side surfaces of each distal portion 17A and the side surfaces of each constricted portion 20 (i.e., wall surfaces of recesses 20X). However, the plating layer 31 may partially cover the side surfaces of each distal portion 17A and the side surfaces of each constricted portion 20.

In the above embodiment and modified examples, the lead frame 10 is used for a small outline package (SOP), and the semiconductor device 40 has an SOP structure. However, application of the lead frame structure described above is not particularly limited to an SOP. For example, the lead frame structure described above may be applied to a lead frame used for a quad flat package (QFP) and a semiconductor device having a QFP structure. The lead frame structure described above may also be applied to a lead frame used for a dual inline package (DIP) and a semiconductor device having a DIP structure.

In the above embodiment and modified examples, the die pad 12 may be omitted.

In the above embodiment and modified examples, the number of semiconductor elements 50 mounted on the lead frame 10 may be changed, and the mounting method of the semiconductor element 50 (e.g., wire bonding, flip chip, and combination of wire bonding and flip chip) may be changed.

CLAUSES

This disclosure further encompasses the following embodiment.

1. A method for manufacturing a lead frame, the method including:

preparing a metal plate;

forming a first opening by stamping the metal plate, wherein the first opening defines a dam bar, a distal portion of an inner lead connected to one side of the dam bar, and an outer lead connected to another side of the dam bar;

forming a plating layer that covers an upper surface and a side surface of the metal plate located in a region encapsulated by an encapsulation resin; and forming a second opening by stamping the metal plate, wherein the second opening is in communication with the first opening and defines a basal portion of the inner lead;

wherein the forming a plating layer includes covering an upper surface and a side surface of the distal portion with the plating layer.

2. The method according to clause 1, wherein: the forming a first opening includes forming an expanded portion extending toward the dam bar from the first opening, wherein the expanded portion is larger than a portion of the first opening that defines the distal portion; and the forming a second opening includes forming the second opening so that a portion of the second opening that is in communication with the expanded portion has a smaller width than the expanded portion.

3. The method according to clause 2, wherein:

the forming a first opening includes punching out a given portion of the metal plate with a first punch to form the first opening that includes the expanded portion, and the first opening that includes the expanded portion defines the distal portion and a constricted portion, which is connected to the distal portion and the has a smaller width than the distal portion; and the forming a second opening includes punching out a given portion of the metal plate including part of a wall surface of the expanded portion with a second punch to form the second opening so that the constricted portion connects the distal portion and the basal portion.

4. The method according to clause 2, wherein: the forming a first opening includes punching out a given portion of the metal plate with a first punch to form the first opening that includes the expanded portion, and the first opening that includes the expanded portion defines the distal portion and a constricted portion, which is connected to the distal portion and has a smaller width than the distal portion; and the forming a second opening includes punching out a given portion of the metal plate including part of a wall surface of the expanded portion with a second punch to form the second opening so that a wide portion having a larger width than the basal portion connects the constricted portion and the basal portion.

The present examples and embodiments are to be considered as illustrative and not restrictive, and the invention is not to be limited to the details given herein, but may be modified within the scope and equivalence of the appended claims.

The invention claimed is:

1. A lead frame comprising:
a dam bar;
leads connected to each other by the dam bar, wherein each of the leads includes
  an inner lead, which is located at one side of the dam bar, and
  an outer lead, which is located at another side of the dam bar and formed integrally with the inner lead; and
a plating layer formed on each inner lead;
wherein
each inner lead includes
  a basal portion located at a side closer to the dam bar,
  a distal portion located at a side opposite to the basal portion, and
  an intermediate portion that connects the distal portion and the basal portion and has a width that differs from a width of the distal portion;
the plating layer covers an upper surface and a side surface of the distal portion and covers at least part of a side surface of the intermediate portion; and
a side surface of the basal portion and a side surface of the dam bar are entirely located outside the plating layer.

2. The lead frame according to claim 1, wherein
the intermediate portion includes a constricted portion having a width that is smaller than the width of the distal portion, and
the plating layer entirely covers a side surface of the constricted portion.

3. The lead frame according to claim 2, wherein:
the intermediate portion further includes a wide portion that connects the constricted portion and the basal portion, wherein the wide portion has a width that is larger than a width of the basal portion;
the plating layer entirely covers a wall surface of a recess defining the constricted portion, wherein the recess is formed by part of the side surface of the distal portion, the side surface of the constricted portion, and part of a side surface of the wide portion; and
a remaining part of the side surface of the wide portion that connects the wall surface of the recess and the side surface of the basal portion is located outside the plating layer.

4. The lead frame according to claim 1, wherein
the intermediate portion includes a wide portion having a width that is larger than the width of the distal portion;
the plating layer entirely covers a first side surface section of the wide portion, wherein the first side surface section of the wide portion contacts the side surface of the distal portion and extends outward from the side surface of the distal portion; and
the wide portion includes a second side surface section that connects the first side surface section of the wide portion and the side surface of the basal portion, wherein the second side surface section is located outside the plating layer.

5. A lead frame comprising:
a die pad;
a dam bar;
leads connected to each other by the dam bar, wherein each of the leads includes
  an inner lead, which is located at one side of the dam bar, extending toward the die pad, and
  an outer lead, which is located at another side of the dam bar, extending away from the die pad and formed integrally with the inner lead; and
a first plating layer formed on each inner lead; and
a second plating layer covering an upper surface and a side surface of the die pad;
wherein
each inner lead includes
  a basal portion located at a side closer to the dam bar,
  a distal portion located at a side opposite to the basal portion, and
  an intermediate portion that connects the distal portion and the basal portion and has a width that differs from a width of the distal portion,
the first plating layer covers an upper surface and a side surface of the distal portion and covers at least part of a side surface of the intermediate portion; and
a side surface of the basal portion and a side surface of the dam bar are entirely located outside the first plating layer.

6. The lead frame according to claim 5, wherein
the intermediate portion includes a constricted portion having a width that is smaller than the width of the distal portion, and
the first plating layer entirely covers a side surface of the constricted portion.

7. The lead frame according to claim 6, wherein:
the intermediate portion further includes a wide portion that connects the constricted portion and the basal portion, wherein the wide portion has a width that is larger than a width of the basal portion;
the first plating layer entirely covers a wall surface of a recess defining the constricted portion, wherein the recess is formed by part of the side surface of the distal portion, the side surface of the constricted portion, and part of a side surface of the wide portion; and
a remaining part of the side surface of the wide portion that connects the wall surface of the recess and the side surface of the basal portion is located outside the first plating layer.

8. The lead frame according to claim 5, wherein
the intermediate portion includes a wide portion having a width that is larger than the width of the distal portion;
the first plating layer entirely covers a first side surface section of the wide portion, wherein the first side surface section of the wide portion contacts the side surface of the distal portion and extends outward from the side surface of the distal portion; and
the wide portion includes a second side surface section that connects the first side surface section of the wide portion and the side surface of the basal portion, wherein the second side surface section is located outside the first plating layer.

9. A semiconductor device comprising:
a lead frame including leads;

a plating layer covering part of each lead;
a semiconductor element electrically connected to each lead and mounted on the lead frame; and
an encapsulation resin that encapsulates the semiconductor element;
wherein
each of the leads includes
   an inner lead, which is encapsulated in the encapsulation resin, and
   an outer lead, which is formed integrally with the inner lead and located outside the encapsulation resin;
the inner lead includes
   a basal portion located at a side closer to the outer lead,
   a distal portion located at a side opposite to the basal portion, and
   an intermediate portion that connects the distal portion and the basal portion and has a width that differs from a width of the distal portion,
the plating layer covers an upper surface and a side surface of the distal portion and covers at least part of a side surface of the intermediate portion, and the plating layer is formed only in a region encapsulated in the encapsulation resin; and
a side surface of the basal portion is entirely located outside the plating layer.

* * * * *